United States Patent [19]
Rummel et al.

[11] Patent Number: 4,705,954
[45] Date of Patent: Nov. 10, 1987

[54] METHOD AND APPARATUS FOR AUTOMATICALLY POSITIONING A PARTICLE BEAM

[75] Inventors: Peter Rummel, Festenbach; Eckhard Wolfgang, Munich, both of Fed. Rep. of Germany

[73] Assignee: Siemens Aktiengesellschaft, Berlin and Munich, Fed. Rep. of Germany

[21] Appl. No.: 766,448

[22] Filed: Aug. 19, 1985

[30] Foreign Application Priority Data

Sep. 4, 1984 [DE] Fed. Rep. of Germany ....... 3432479

[51] Int. Cl.$^4$ .......................................... G01N 23/225
[52] U.S. Cl. .................................... 250/491.1; 250/307
[58] Field of Search .............................. 250/491.1, 307

[56] References Cited

U.S. PATENT DOCUMENTS

| | | | |
|---|---|---|---|
| 3,628,012 | 12/1971 | Plows | 250/49 |
| 3,644,700 | 2/1972 | Kruppa et al. | 219/121 |
| 4,241,259 | 12/1980 | Feuerbaum et al. | 250/457 |
| 4,277,679 | 7/1981 | Feuerbaum | 250/310 |
| 4,413,181 | 11/1983 | Feuerbaum | 250/310 |

FOREIGN PATENT DOCUMENTS

| | | | |
|---|---|---|---|
| 55-91826 | 7/1980 | Japan. | |
| 57-95628 | 6/1982 | Japan | 250/491.1 |

OTHER PUBLICATIONS

Siemens Program Service–Siemens System 300, Library Math, 1/1/76.
Trans. of Inst. of Electr. & Comm. Engineers of Japan, vol. E64 (1981) May, No. 5, Tokyo, Japan "Function Testing of Bipolar and MOS LSI Circuits with a Combined Stroboscopic Sem-Microcomputer System, Fujioka et al., pp. 295–301.

Primary Examiner—Jack I. Berman
Attorney, Agent, or Firm—Hill, Van Santen, Steadman & Simpson

[57] ABSTRACT

A particle probe is positioned to a specific region when an actual position of the specific region appears shifted relative to its rated position due to local fields, and can therefore not be defined with high precision. The particle probe is positioned to a prescribed region. The particle probe is then deflected in the environment of this region such that the particle probe impinges different regions at the prescribed region. The position of the specific region is determined from the measured signals which are triggered given incidence of the particle probe on the different regions. The particle probe is then positioned to the specific region. An electrical line may form a test spot at the specific region wherein one dimension thereof is greater than a width thereof.

7 Claims, 5 Drawing Figures

METHOD AND APPARATUS FOR AUTOMATICALLY POSITIONING A PARTICLE BEAM

BACKGROUND OF THE INVENTION

The invention relates to a method and an apparatus for the automatic positioning of a particle beam to a test spot whose actual position appears shifted relative to its rated position due to local fields.

An electron probe is used for measurements of voltages and voltage progressions in the inside of integrated circuits. The measuring locations are usually metallic interconnects or test spots at the highest interconnect level. In order to reliably position the electron probe in the center of the respective interconnect or of the respective test spot, an automatic positioning of the electron probe is desirable. The dimensions of a test spot or of an interconnect width currently amount to a few μm and will be further reduced in the future. In case the electron probe moves away from the center of the interconnect under investigation, or away from the center of the investigated test spot due to instabilities of the measuring installation employed, or for other reasons, for example as a consequence of electric fields, this movement should be registered and compensated.

The positioning of the electron probe occurs in electron beam measuring instruments (which are usually modified scanning electron microscopes) in a so-called image/point mode. In this image/point mode, the electron beam is alternately swept across the specimen so that an image is generated, and it is then again directed to a specific measuring point. This procedure wherein an image is generated and the electron beam is then directed to a specific measuring point in alternating fashion is repeated so quickly that the specific measuring location is visible on the picture and that, with the assistance of potentiometers which control the voltages for the deflection coils of the scanning electron microscope, the positioning of the electron beam probe can be modified such that the specefic measuring location coincides with a specific measuring point within the specimen An electron beam measuring instrument is disclosed, for example, by U.S. Pat. No. 4,277,679, incorporated herein by reference.

It would be ideal if, similar to usual electron beam lithography, the electron probe would impinge the desired location on the subject with high precision. Such a method for positioning an electron beam is disclosed, for example, by U.S. Pat. No. 3,644,700, incorporated herein by reference. This, however, is impossible in electron beam measurement technology since local fields, such as, for example, local temperature fluctuations or local electrical fields, make the exact position of the respective measuring location appear shifted and thus do not allow the exact position of the respective measuring location to be precisely defined at the outset. The local fields which cause these apparent deviations of the actual position value of a measuring point from the rated position value of this measuring point cannot be exactly defined and are generally also subject to additional chronological fluctuations during a measurement or (in more general terms) during a processing of the specimen.

SUMMARY OF THE INVENTION

An object of the present invention is to specify a method and an apparatus of the type initially cited with which the particle probe can also be positioned to the desired point when the position of this point can not be defined with high precision at the outset due to local fields.

This object is achieved by providing a method and apparatus wherein the particle probe is positioned to a prescribed region. The particle probe is deflected in an environment of the region such that the particle probe impinges different regions. Measured signals triggered given incidence of the particle probe on the different regions are detected. A position of the specific region from the measured signals is determined. The particle probe is then positioned to this region.

The invention is not limited to the employment of an electron beam. Any other light probe or ion probe can be employed for the implementation ot a method of the invention.

The invention is not limited to electron beam measuring technology. The invention can also be employed in any other processing mode of a subject wherein the positioning of a particle probe on a desired region is made more complicated since the actual position of this desired region in the corresponding particle microscope appears shifted relative to the rated position of this desired region due to local fields. Such local fields can be magnetic fields, electrical fields, temperature fields, etc. Temperature fluctuations arise, for example, when an electrical conductor is heated because a current is conducted in it. Magnetic fields can, for example, arise due to currents. Local electrical fields play a role when, for example, regions having different electrical potentials ar adjacent to one another.

When the region to which the particle probe is to be positioned has a different electrical potential than a neighboring region, then the particle probe can be positioned to the desired region with the assistance of a potential contrast in a way similar to that specified in the exemplary embodiment of the specification for positioning with the assistance of the so-called edge or Eberhard effect. The transfer from edge or Eberhard effect to the potential contrast is well known to those skilled in this art.

When the region to which the particle probe is to be positioned has roughly the same potential as its environment, then the positioning of the particle probe is advantageously executed with the assistance of the edge or Eberhard effect. This is advantageous particularly when the positioning is to occur to an interconnect within an integrated circuit because the transition from the interconnect to the environment of this interconnect, generally an insulating area, shows particularly good edge or Eberhard effects. When with the invention, a particularly pronounced edge or Eberhard effect is to be anticipated, but when at the same time the potential of the desired region to which the particle probe is to be positioned differs from the potential of the environment of this desired region, then a positioning is advantageously undertaken with the assistance of the edge or Eberhard effect. Thus, the potential contrast is suppressed at the same time. In order to be able to optimally receive the signal generated due to the edge or Eberhard effect, a suitable voltage, for example 0 volts, is applied to the opposing field of the electron spectrometer for the suppression of the potential contrast in an electron beam measuring instrument.

In special cases, for example for the selection of one electrical line from a variety of neighboring electrical lines, it can be favorable or necessary ro evaluate the signal resulting from the potential contrast.

The cause of the edge or Eberhard effect is described in any textbook of scanning electron microscopy. The edge or Eberhard effect arises due to additional secondary electron emission at the edges of a region, for example at the interconnect flanks within an integrated circuit. An increased backscatter of particles and an increased secondary electron yield appear at a salient edge or at a projecting subject structure, since the diffusion cloud is more highly defined there and since, as a result thereof, more backscattered or transmitted particles can leave the specimen. These backscattered or transmitted particles also trigger more secondary electrons when they exit the specimen, particularly because they have lost energy in the specimen and penetrare the surface at an oblique angle.

For a method of the invention, however, other measured signals can also be employed, for example contrast due to surface inclination, contrast due to shadowing, material contrast, or contrast due to any other differenr properties of neighboring regions or at the boundary between neighboring regions.

It is important in automatic positioning within an integrated circuit that the scan rate be as high as possible so that the charging of insulating regions is suppressed. A suitable energy of the primary particles at which precisely as many charges impinge the surface as charges depart this surface, however, is also suitable to avoid the charging of insulating regions.

The term "different regions" indicates that these regions or the boundary between these regions can be clearly discriminated in a measured signal.

For automatic positioning, the particle probe can be scanned across different regions along lines. The particle probe, however, can also be simply deflected for this purpose in such a fashion that it impinges prints in different regions, the distances between these points being clearly defined. Such a clear definition of distances between different points is possible, for example, with the assistance of a digital scan generator.

DESCRIPTION OF THE PREFERRED EMBODIMENTS

Figure 1:
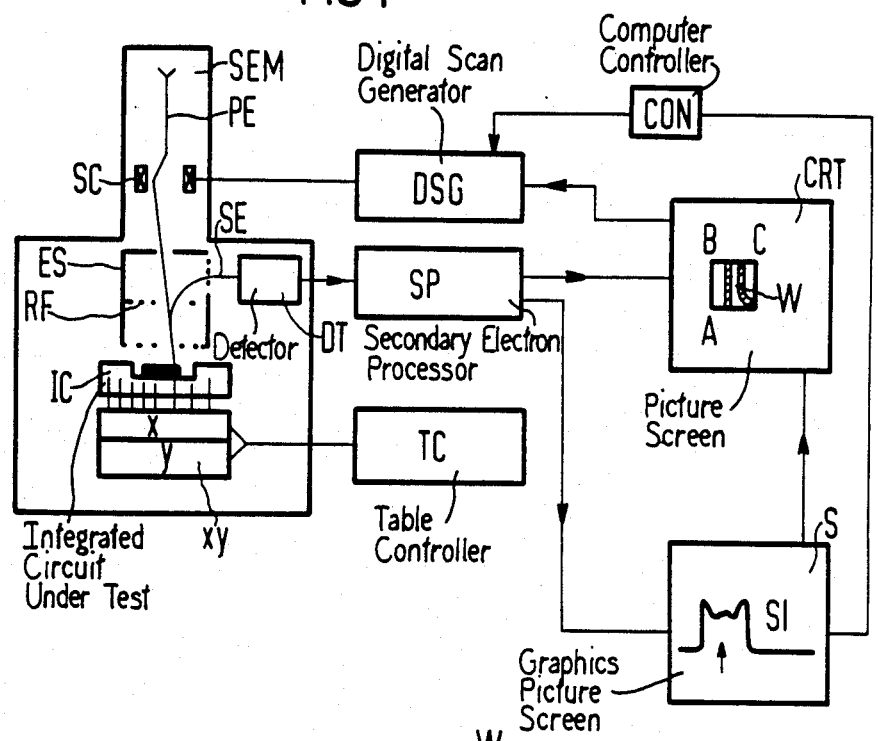
FIG. 1 shows an arrangement for implementation of a method of the invention.

FIG. 1 shows an arrangement for the implementation of a method of the invention. An essential component part of this arrangement is an electron beam measuring instrument SEM as disclosed, for example, in U.S. Pat. Nos. 4,241,259 and 4,277,679, both incorporated herein by reference. Primary electrons PE can be deflected with the assistance of scan coils SC and can be positioned to a desired point within an integrated circuit IC. Upon incidence of the primary electrons PE, secondary electrons SE are triggered at the point of incidence within the integrated circuit IC. Some of these secondary electrons SE can overcome the retarding field of a retarding field electrode RF, are deflected within an electron spectrometer ES toward a detector DT, and are documented in this detector DT. A secondary electron measured signal thus arises. This secondary electron measured signal is subsequently further handled in a signal processing chain SP. The secondary electron processing chain SP usually contains a photomultiplier and a variety of following amplifiers or a so-called "boxcar" integrator as disclosed, for example in U.S. Pat. No. 4,413,181, incorporated herein by reference. An output signal of the secondary electron measured signal processing chain SP results in the picture screen CRT of the employed electron beam measuring instrument SEM. An output signal of the secondary electron measured signal processing chain SP is connected to a graphics picture screen S. A digital scan generator DSG is driven via an output signal of the picture screen CRT, this digital scan generator DSG in turn supplying the scan coils SC with the voltages required for a desired deflection of the primary electrons PE. Via table controller TC, the position of the integrated circuit IC rigidly connected to a table XY can be roughly adjusted.

Figure 2:
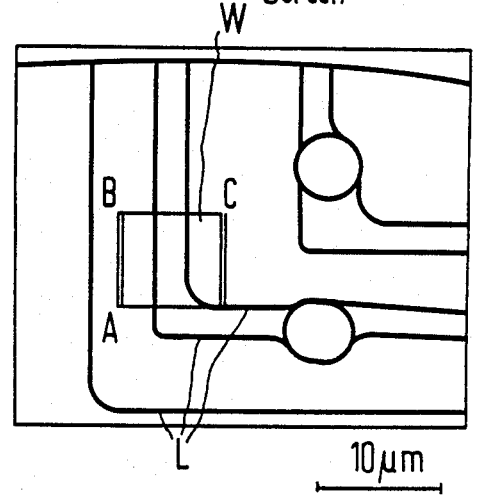
FIG. 2 explains positioning of an electron probe to an interconnect.

FIG. 2 explains a method of the invention. With the coordinate systems which define the points on the surface of the table XY, the points on the surface of the integrated circuit IC, and the two-dimensional deflection effect of the deflection devices formed of the scan coils SC directed to one another, basically any point within the integrated circuit IC can be automatically brought into position with the assistance of the stepping motors of the table XY. Thus, the electron probe can impinge this point. The precision of this positioning with the assistance of the stepping motor or the table XY, however, lies within an area whose length and width amount to 14 mm given only ±15 µm. This high imprecision is not only caused by the poor setting of the table XY, but also because of local fields at the incidence point of the electron probe within the integrated circuit IC. This high imprecision of ±15 µm in the positioning of the electron probe to a measuring point within the integrated circuit IC is inadequate when one considers that the width of an electrical interconnect within an integrated circuit IC is about 1 µm and will become even smaller in the future. In order to improve the positioning, a part of the surface of the integrated circuit IC is imaged on the picture screen CRT with the assistance of a stroboscopic measuring method. Such a stroboscopic measuring method is disclosed, for example, in U.S. Pat. No. 3,628,012, incorporated herein by reference. The stroboscopically recorded image of the surface of the integrated circuit IC can be input into an image memory. It is thus assured that the electron probe loads the surface of the integrated circuit IC with a beam of charged articles for only a short time. The stored image of the surface of the integrated circuit IC is displayed on the picture screen CRT. The desired measuring location to which the electron probe should be positioned is marked with the assistance of a window W variable in size and position. It is marked such that a side edge of the window W lies transversely over a selected interconnect L. This side edge of the window which lies at right angles relative to a selected interconnect L is the connecting line between points B and C in FIG. 2. The connecting line between the two points A and B thus lies perpendicular to the connecting line between the two points B and C. The electron probe repeatedly scans along the two connecting lines between the prints A and B or B and C. The scan along the connecting line between points A and B occurs because the noise background of the measuring signal is defined thereby. The selected interconnect L, or the edges of the selected interconnect L, supply a higher secondary electron signal than the oxide. Thus, the selected interconnect L is intersected by the connecting line between points B and C. The ratio of the measured signal acquired from the scanning of the connecting line between point B and C and the measured signal acquired from scanning of the connecting line between the points A and B, is therefore formed. The number of scannings necessary for an adequately good positional recognition or for an adequately good signal-to-noise ratio along the connecting lines between points A and B or B and C is concluded from this ratio.

Figure 3:
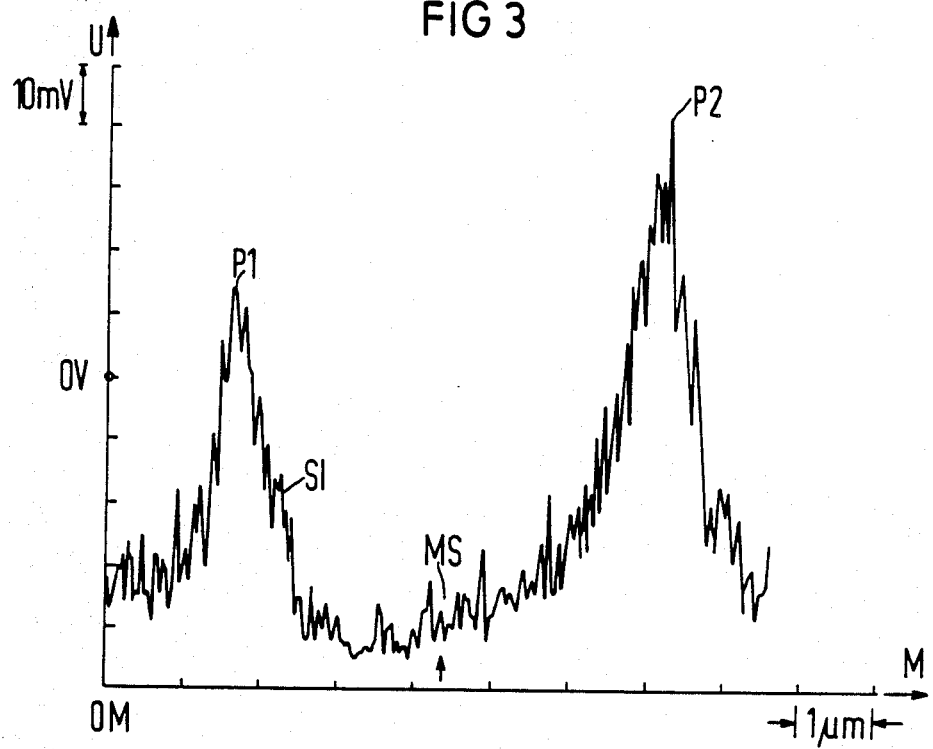
FIG. 3 shows a measured signal acquired in a positioning of an electron probe.

FIG. 3 shows a measured signal SI acquired by a method of the invention with the assistance of the so-called edge or Eberhard effect. This measured signal SI is shown in the measuring installation of FIG. 1 on the graphics picture screen S. The edges of the selected interconnect L are identified by the peaks P1, P2 of the measured signal SI. The center MS of the selected interconnect L is indicated in FIG. 3 with an arrow. The result of this search for the center of the interconnect is, for example, forwarded via the picture screen CRT or via a computer controller CON, to the digital scan generator DSG. The electron probe is correspondingly positioned to the center MS of the selected interconnect L via the deflection coils SC.

When the pre-positioning with the assistance of the table XY is so good that a window W no longer has to be marked around a selected interconnect L, the specified procedure can sequence without additional marking of a window W simply with the input of the rated coordinates of a point within a selected interconnect L.

The measured signal SI of FIG. 3 was acquired with an electron probe which had a pulse width of 5 ns and a probe current of 2nA (duty cycle=1:1000).

The surface of the integraed circuit IC was imaged for pre-positioning on the picture screen CRT with a magnification of greater than 1000x.

In order to avoid charging of the insulating regions (oxides) which neighbor the electrically conductive regions, the scanning for searching the center of the interconnect can also be executed in the form of a T. Therfore, the scanning for the identification of the noise signal is executed on an interconnect L in the direction of this interconect L and not on the oxide as shown in FIG. 2.

What is important for a method of the invention is that two separate signals are acquired. One signal contains either only the noise or only the interconnect signal. The other signal contains both the noise as well as the interconnect signal. Formulated in even more general terms, the two signals must be established such that the noise signal and the useful signal can be separated from one another. What is to be viewed as a boundary condition is when measures points are disposed adequately close to the boundary between two different regions in order to be able to define the postion of a specific measuring point within a desired region.

When the result of the seach of the center of the interconnect is output on the graphics picture screen S, the possibility exists of carrying out a manual correction by shifting the arrow which indicates the interconnect center MS.

During or after a measurement, the drift of the electron probe can be identified by repeating the search for the interconnect center and by forming the difference of the various center values MS. Under given conditions, this can be compensated by following up with the electron probe.

An automatic interconnect center regulation can be executed by cyclical identification of the interconnect center MS during the measurement, and by reduction of the actual position value to the probe positioning. An output signal from the graphics picture screen S can be directly forwarded to the digital scan generator DSG for this purpose. Serving, for example, as the rated position value in such an automatic interconnect center regulation are the interconnect center coordinates identified at the beginning of the measurement.

A specific sub-program for interconnect center searching shall be specified below. It is thus possible without further effort for a person skilled in the art to modify such a program in a corresponding manner when he does not wish to position a particle probe to the center, but rather to some other defined region within an area which need necessarily be an interconnect. The only thing important is that the spatial position of the defined region can be determined on the basis of a significant structure of a measured signal and that this spatial position of this defined region is to be expected in an apparently shifted position due to local fields.

The coordinates of the center of an interconnect L can be identified with the assistance of the sub-program LEITSU which can sequence in the computer controller CON. This occurs with the assistance of a voltage signal that is acquired by scanning transversely across the interconnect L. This scanning at right angles across the interconnect L is executed, for example, such that one half of the scan curve proceeds parallel to the interconnect L and the other half of the scan curve proceeds perpendicular to the interconnect L. If the scan curve were to proceed differently, the sub-progrm LEITSU would have to be correspondingly varied.

In the specific example, the measured voltage signal during one half of the scanning is composed of a pure noise signal and is composed of a superimposition of a noise signal and a useful signal during the other half of the scanning. The measured voltage signal has a DC cmponent during the entire scanning.

Due to the potential contrast which results when the interconnect L has a potential different from its environment, or due to the edge or Eberhard effect, the measured signal curve comprises a rise or a drop in the region of the interconnect edges, whereby the position of the interconnect L and the center of the interconnect L can be identfied. Since a one-time scanning at right angles relative to the interconnect L might possibly supply too weak a useful signal, the scanning at right angles relative to the interconnec L is repeated until a satisfacotry final result is preset on the basis of a statistical evaluation of all measured results achieved. The sub-program LEITSU thus first idenifies the number SCANWI of scannings at right angles relative to the interconnect L necessary to obtain an adequate result of the interconnect center search, and then indicates coordinates of the interconnect center. For this purpose, the sub-program LEITSU contains, as inputs, the number RASTER of scan points which are provided in the image memory per coordinate axs, the length LSCAN of the scan curve at right angles relative to the interconnect L (this length LSCAN being expressed as a defined number of scan points), the measuring field SCAN which allocates the corresponding measured signal to every scan point along the scan curve, and the interconnect width LEITB which, for example, can be indicated in μm.

The signal-to-noise ratio of the measured signal without its DC component defines how often a scanning must be undertaken at right angles relative to the inerconnect L, so that an adequate result is achieved. When the measured results of a plurality of scans undertaken along the same scan curve perpendicular to the interconnect are summed up, not only is the useful signal improved in the sum of the measured results, but the noise signal is also reduced. The noise signal is a statistically fluctuating value and therefore becomes arbitrarily small given an arbitrary plurality of measurements. When a defined, for example empirically identified, rated value QSOLL of the signal-to-noise ratio forms the basis in a measured result summed up over a plurality of scannings, then the number SCANWI of scannings necessary for an adequate result is obtained from the relationship:

$$QSOLL = SR \cdot \sqrt{SCANWI + 1} \cdot \sqrt{\frac{LSCANH}{LBREIT}} \tag{1}$$

where
SCANWI—Number of repetitions of scannings;
SR—Signal-to-noise ratio in a single scan;
LSCANH—Half the length of a scan curve, expressed in scan points;
LBREIT—Width of the interconnect L, expressed in scan points; and
$\sqrt{LSCANH/LBREIT}$—Correction factor which compensates the undesired dependency of the signal-to-noise ratio SR on the size of the interconnect width in relationship to the length of a scan curve.

The signal-to-noise ratio SR in an individual scanning is defined below.

Deriving from equation (1) by transformation is:

$$SCANWI = \frac{QSOLL^2}{SR^2} \cdot \frac{LBREIT}{LSCANH} - 1. \tag{2}$$

In order to identify the signal-to-noise ratio SR in an individual scanning, the measured signal acquired in an individual scanning must be reduced by its DC component. Since the scanning curve proceeds such the one half of the scanning curve is parallel to the interconnect L and the other half of the scanning curve is perpendicular to the interconnect L, a check must be performed to find out in which of the two halves of the scanning curve the useful signal is situated. The useful signal can be both positive as well as negative, since different cases must be taken into consideration. For example, it is unknown in which of the two halves of the scanning curve the useful signal is acquired and thus whether the useful signal is positive or negative.

A decision criterion relative to which of the two halves of the scanning curve the useful signal is acquired, is represented by the comparison of the standard deviations of the measured results of the two halves of the scanning curve. The lower value of the standard deviations belongs to that half of the scanning curve in which only a sure noise signal is acquired. For calculating the standard deviation, use is made of the sub-program SUBROUTINE SIGMA of the Library MATH (Library MATH, mathematical FORTRAN-SUBROUTINES, description, P7100-U0001-X-X-35) which also calculates the mean value of the measured values belonging to the individual valves of the scanning curve at the same time. The respectives corresponding standard deviation S1 or S2, and the respectively corresponding mean value MW1 or MW2, is thus obtained for each half of the scanning curve. Deriving therefrom with assistance of the following equations are the DC component MW of the measured signal, the effective value EFFW1 of the pure noise signal reduced by the DC component MW, and the effective value EFFW2 of the measured signal of that half of the scanning curve which contains the useful signal and which is likewise reduced by the DC component MW:

$$EFFW1 = S1 \text{ with } S1 < S2 \tag{3}$$

$$EFFW2 = \sqrt{(MW2 - MW1)^2 + S2^2} \tag{4}$$

$$MW = MW1 \tag{5}$$

The mean value MW1 of the pure noise signal is thus equal to the DC component MW of the measured signal. The standard deviation S1 of the pure noise signal is smaller than the standard deviation S2 of the measured signal affected by the useful signal.

With equation (2), the number SCANWI of repetitions of scanning required for an adequate measured result now derives from equations (3), (4), (5), (8).

For calculating the interconnect center, the values of the measuring field SCAN are first reduced by the DC component MW. A curve of the measured signal free of the mean value is thus obtained. The measured signal acquired in such fashion which, in a specific exemplary embodiment, is available as a numerical sequence of a maximum of 512 successive numerical values is, however, still superimposed with strong noise. Since the signal-to-noise ratio SR may possibly be rather small, a preprocessing of the measured signal is preferred. First, a suppression or reduction of the noise level is provided and, second an improvement of the useful signal results.

The measured signal is smoothed for this purpose. This occurs, for example, with the assistance of the sub-program SUBROUTINE GLEX specified on page 166 in the afore-mentioned Library MATH. This subroutine is an exponential smoothing of a numerical sequence whose quality can be varied by a constant G. For consideration as a further possibility for smoothing the measured signal is a simple linear smoothing, for example by means of mean value formation over the specific plurality of points. This mean value formation would then possibly have to be repeatedly applied.

Recommended as an excellent method for smoothing the measured signal is a type of "correlation" since the width of the interconnect L is also taken into consideration. Beginning with a first value of the measuring field SCAN, a defined plurality of numerical values of this measuring field SCAN are summed up and this sum is allocated to the first value of the measuring field SCAN. Employed, for example, as the specific plurality of numerical values over which summing is carried out is that number which results when the interconnect width is calculated in scan points. The interconnect width expressed in scan points is thus selected as the "window width" of the "correlation". Every numerical value of the measuring field SCAN thus has a sum allocated to it which derives when a specific plurality of numerical values of the measuring field SCAN is summed up, whereby this sum must have a fixed relationship to that numerical value of the measuring field SCAN to which it is finally allocated. For example, given every numerical value of a numerical value sequence, the sum allocated to the preceding numerical value can be reduced by the oldest numerical value and can be increased by a new numerical value of the numerical value sequence, and finally can be allocated to the corresponding numerical value. In the ideal case, i.e. given a rectangular measured signal and given a window width identical to the width of the measured rectangular signal, an equilateral triangle is obtained in this method insofar as the measured rectangular signal has adequate spacing both from the beginning as well as from the end of the measured signal. As the experiments show, this method of correlation supplied satisfactory results given a rectangular function superimposed with strong noise, for not only is the noise reduced in this method but the useful signal is also amplified by a multiple. When the window width does not precisely coincide with the width of the useful signal, this often being the case in practice, a triangular shape, which is more or less flattened at the top, is obtained with the assistance of the method of correltion. With such a signal progression which can be stored in a field SUM of variables, the center point of the interconnect L can be concluded in a rather simple fashion, namely by defining the center of gravity coordinates of the signal area which results. After a change of operational sign of all negative values of the field SUM, all values which lie below a defined tnreshold are eliminated, i.e. are set equal to zero. The center of gravity coordinate, expressed as a function of the running index of the field is then obtained by summing up all products of amplitudes $U_i$ of the useful signal and running index small i, and after division of this sum by the amplitude sum:

$$i_s = \frac{\sum_i U_i \cdot i}{\sum_i U_i} \quad (6)$$

Since rather large numerical values thereby occur, INTEGER*4-variables must be employed.

The correlation field SUM has been formed such that every value of the measuring field SCAN has had a sum allocated to it obtained when this measured value is taken as a first summand and as many following numerical values as have space in the window width of the correlation or as correspond to the scan points of the interconnect width have then been added thereto. The center of gravity coordinate $i_s$ then lies approximately at an edge of the interconnect L. The coordinate of the interconnect center $i_m$ then results from the center of gravity coordinate $i_s$:

$$i_m = i_s + \frac{LBREIT}{2} \quad (7)$$

The allocation of this interconnect center $i_m$ to the center point of the respective scanning curve results by a simple conversion.

The above-specified signal-to-noise ratio SR is defined according to the following equation:

$$SR = \frac{EFFW2}{EFFW1} - 1 \quad (8)$$

The signal-to-noise ratio SR is thus the quotient of the effective value EFFW2 of the measured signal affected with the useful signal, and the effective value EFFW1 of the pure noise signal reduced by 1. Accordingly, both effective values are reduced by the DC component EW. The signal-to-noise ratio SR permits conclusions as to the precision of the result to be anticipated. When the signal-to-noise ratio SR is greater than 1.5, then the deviation of the result from the true value is a maximum of ±3 scan points (in rare instances). Given an assumed interconnect width of 60 scan points or 2 $\mu$m, this represents a maximum error of ±10% of the interconnect width. The precision of the result does not significanty improve or deteriorate, given a reduction or enlargement or the interconnect width. The form of the measured signal likewise plays no part in the precision of the result insofar as it does not exhibit any greater asymmetries.

When the width of the interconnect L is specified with 60 scan points, 256 scan points can, for example, be used for the length of the scanning curve.

Given greater asymmetries of the useful signal, the interconnect center identification by means of the center of gravity method does not supply particularly good results under certain conditions. Insofar as the asymmetries involved are always identical asymmetries, the measured signal can be corrected by a constant correction value. In case nonsystematic, irregularly appearing asymmetries are present, the smooth signal can, for example, be clipped after a certain value. The useful signal is thus robbed of its asymmetry by flattening whereby, however, a part of the information contained in the signal is lost.

Figure 4:
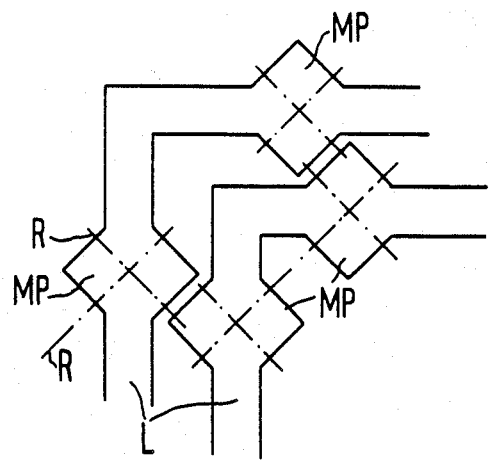
FIGS. 4 and 5 show preferred embodiments in employing the invention.

FIG. 4 shows a preferred embodiment of test spots MP. In order for internal test spots MP to be better recognized in the automatic positioning, these test spots MP should have the shape of a square (oval, rectangle circle, etc.). Thus, two points of this square are respectively disposed on the center of the interconnect L and the side length of the square is greater than the width of the interconnect L. The squares of the test spots MP can be scanned parallel to the sides of the square for automatic positioning of a particle probe. The scan curves R then lie obliquely relative to the center line of the interconnect L. The special shape of the test spots MP enables an effective broadening of the test spots MP and a fast and reliable locating of the two coordinates of the test point MP, i.e. both of the X-coordinate as well as of the Y-coordinate of the test point MP.

Figure 5:
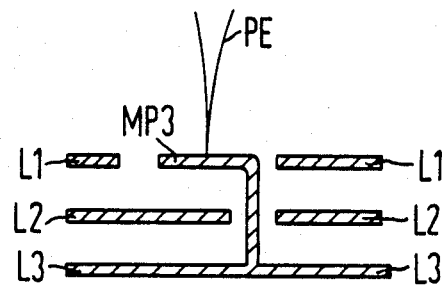

FIG. 5 shows a further preferred embodiment of a test spot MP3. When an interconnect L3 is situated below two other interconnect levels having the interconnects L1, L2, which can be the case for example in an integrated circuit constructed in various superimposed layers, a contact spot MP3 in a metallization plane can be created for a circuit node disposed on the interconnect L3, the electron probe PE still having access to this contact spot MP3. The contact spot MP3 is conductively connected to the circuit node which is disposed on the interconnect L3.

Although various minor charges and modifications might be proposed by those skilled in the art, it will be understood that we wish to include within the claims of the patent warranted hereon all such changes and modifications as reasonably come within our contribution to the art.

We claim as our invention:

1. A method for automatically positioning a particle probe to a center of an electrical interconnect having a longitudinal extent and laying within a general region on a specimen wherein an apparent position shift of the electrical interconnect from its actual position, which may occur due to local fields, is compensated, comprising the steps of:
   positioning the particle probe to the general region and moving the particle probe within said general region along a first scan line path either alongside the interconnect without intersecting the interconnect or directly on the interconnect without leaving the interconnect, and along a second scan line path which is transverse to the longitudinal extent of the interconnect and which sweeps across the interconnect and also neighboring regions alongside the interconnect;
   detecting measured signals triggered as a result of secondary electrons which result from incidence of said particle probe in said general regions and onto the interconnect; and
   locating the center of the interconnect by utilizing increased contrast at edges of the interconnect in signals resulting from scanning along said second scan line path so as to locate the edges of the interconnect, and employing signals from scanning along said first scan line path for use in determining a noise background of the measured signals.

2. A method according to claim 1 wherein he first scan line path is substantially parallel to the interconnect longitudinal extent and the scan line path is substantially perpendicular to the interconnect longitudinal extent.

3. A method according to claim 1 wherein the increased contrast at edges of the interconnect occurs as a result of the Eberhard effect.

4. A method according to claim 1 wherein a number of scans along said first or second scan path is determined based on a ratio of measured signals acquired from scanning said second scan line path and measured signals acquired from scanning said first scan line path.

5. A method for automatically positioning a particle probe to a center of a test spot lying in an electrical interconnect having a longitudinal extent and lying within a general region on a specimen wherein an apparent position shift of the test spot from its actual position, which may occur due to local fields, is compensated, comprising the steps of:
   providing the test spot rectangular in shape;
   positioning the particle probe to the general region and moving the particle probe within said general region along a first scan line path either alongside the interconnect without intersecting the interconnect or directly on the interconnect without leaving the interconnect, and along second and third scan line paths which are transverse to one another and which each run across the test spot and neighboring regions alongside the test spot;
   detecting measured signals triggered as a result of secondary electrons which result from incidence of said particle probe in said general regions and onto the test spot; and
   locating the center of the test spot by utilizing increased contrast at side edges of the test spot effect in signals resulting from scanning along said second and third scan line paths so as to locate the side edges of the test spot, and employing signals from scanning along said first scan line path for use in determining a noise background of the measured signals.

6. A method according to claim 5 wherein the second line paths are substantially perpendicular to the side edges over which they cross and the first scan line path is substantially parallel to the longitudinal extent of the interconnect.

7. A method according to claim 5 wherein the increased contrast at the side edges of the test spot occur as a result of the Eberhard effect.

* * * * *